US010156786B2

United States Patent
Seidel

(10) Patent No.: US 10,156,786 B2
(45) Date of Patent: Dec. 18, 2018

(54) METHOD AND STRUCTURE FOR NANOIMPRINT LITHOGRAPHY MASKS USING OPTICAL FILM COATINGS

(71) Applicant: Thomas E. Seidel, Palm Coast, FL (US)

(72) Inventor: Thomas E. Seidel, Palm Coast, FL (US)

(*) Notice: Subject to any disclaimer, the term of this patent is extended or adjusted under 35 U.S.C. 154(b) by 237 days.

(21) Appl. No.: 15/259,769

(22) Filed: Sep. 8, 2016

(65) Prior Publication Data

US 2017/0090282 A1    Mar. 30, 2017

Related U.S. Application Data

(60) Provisional application No. 62/234,798, filed on Sep. 30, 2015.

(51) Int. Cl.
| | |
|---|---|
| *B29C 43/00* | (2006.01) |
| *G03F 7/00* | (2006.01) |
| *B29C 59/02* | (2006.01) |
| *B29C 59/00* | (2006.01) |

(52) U.S. Cl.
CPC ............ *G03F 7/0002* (2013.01); *B29C 59/00* (2013.01); *B29C 59/022* (2013.01)

(58) Field of Classification Search
CPC ... B29C 33/3842; B29C 33/42; B29C 33/422; B29C 33/424; B29C 33/426; B29C 59/00; B29C 59/002; B29C 59/022
USPC ........................................................ 425/385
See application file for complete search history.

(56) References Cited

U.S. PATENT DOCUMENTS

| | | | |
|---|---|---|---|
| 5,198,267 A | 3/1993 | Aharoni et al. | |
| 5,733,712 A * | 3/1998 | Tanaka ................... | G03F 7/091 430/157 |
| 6,517,977 B2 | 2/2003 | Resnick et al. | |
| 6,562,553 B2 | 5/2003 | Mancini et al. | |
| 6,607,173 B2 | 8/2003 | Westmoreland | |
| 7,307,118 B2 | 12/2007 | Xu et al. | |
| 7,384,569 B1 | 6/2008 | Dakshina-Murthy et al. | |
| 7,452,574 B2 | 11/2008 | Truskett et al. | |
| 7,470,470 B2 | 12/2008 | Senzaki et al. | |
| 7,541,115 B1 | 6/2009 | Volk et al. | |
| 7,553,686 B2 | 6/2009 | George et al. | |
| 7,776,709 B2 | 8/2010 | Colburn et al. | |
| 7,837,921 B2 | 11/2010 | Xu et al. | |
| 8,088,293 B2 | 1/2012 | Sandhu | |
| 8,097,539 B2 | 1/2012 | Itoh | |
| 8,178,011 B2 | 5/2012 | Kruglick | |

(Continued)

FOREIGN PATENT DOCUMENTS

JP        09-278490 A        10/1997

OTHER PUBLICATIONS

Schift, "Nanoimprint lithography: An old story in modern times? A review", J. Vac. Sci. Technol. B (Mar./Apr. 2008), 26(2):458-80.

(Continued)

*Primary Examiner* — Joseph S Del Sole
*Assistant Examiner* — Thu Khanh T Nguyen
(74) *Attorney, Agent, or Firm* — Ascenda Law Group, PC

(57) ABSTRACT

Structures and associated methods for making high index of refraction surface coatings for masks used in imprint lithography for application to patterning for advanced semiconductor and data storage devices.

6 Claims, 2 Drawing Sheets

(56) References Cited

U.S. PATENT DOCUMENTS

| | | |
|---|---|---|
| 8,273,505 B2 | 9/2012 | Sato et al. |
| 2003/0215577 A1 | 11/2003 | Willson et al. |
| 2004/0202865 A1 | 10/2004 | Homola et al. |
| 2004/0209177 A1 | 10/2004 | Sreenivasan et al. |
| 2004/0259037 A1* | 12/2004 | Hatakeyama ........... G03F 7/038 430/312 |
| 2005/0160934 A1 | 7/2005 | Xu et al. |
| 2006/0024590 A1 | 2/2006 | Sandhu |
| 2007/0212494 A1 | 9/2007 | Xu et al. |
| 2014/0335215 A1* | 11/2014 | Hayashi ............... C23C 14/0641 425/385 |

OTHER PUBLICATIONS

Yokoyama; et al., "Self-limiting atomic-layer deposition of Si on SiO2 by alternate supply of Si2H6 and SiCl4", Applied Physics Letter (Jul. 30, 2001), 79(5):617-19.

International Search Report and Written Opinion dated Jan. 18, 2017, from the International Searching Authority: Korean Intellectual Property Office, for PCT/US2016/054853 (filed Sep. 30, 2016), 12 pages.

International Preliminary Report on Patentability dated Apr. 12, 2018, from the International Bureau of WIPO, for PCT/US2016/054853 (filed Sep. 30, 2016), 7 pages.

Klaus; et al., "Atomic Layer Deposition of SiO2 Using Catalyzed and Uncatalyzed Self-Limiting Surface Reactions", Surface Review and Letters (1999), 6(3 & 4): 435-448.

Lee; et al., "Atomic Layer Deposition of AlF3 Using Trimethylaluminum and Hydrogen Fluoride", The Journal of Physical Chemistry (2015), 119:14185-14194.

Lee; et al., "Atomic Layer Deposition of Metal Fluorides Using HF-Pyridine as the Fluorine Precursor", Chemistry of Materials (2016), 28:2022-2032.

Seidel; et al., "Fluorine coatings for nanoimprint lithography masks", SPIE Proceedings Paper (2014), vol. 9049, 8 pages.

\* cited by examiner

METHOD AND STRUCTURE FOR NANOIMPRINT LITHOGRAPHY MASKS USING OPTICAL FILM COATINGS

RELATED APPLICATIONS

This application is a NONPROVISIONAL of and claims priority to U.S. Provisional Application 62/234,798, filed Sep. 30, 2015, incorporated herein by reference.

FIELD OF THE INVENTION

The present invention is related to conformal surface coatings for masks used in imprint lithography for application to patterning for advanced semiconductor and data storage devices; structures and associated methods for making high index of refraction surface coatings to improve productivity, to reduce imprint mask defect levels and improve productivity concurrently, and to achieve masks at smaller dimensions are described.

BACKGROUND

Nano Imprint lithography (NIL) technology typically uses quartz masks with nanometer feature sizes. The mask is placed above and in proximity to a wafer or workpiece coated with photosensitive material. The mask is then closely coupled to the wafer, touching the photosensitive material and drawing it into the features of the mask by capillary action and then exposed to ultraviolet light. Then the mask is separated from the exposed photosensitive material and wafer, leaving behind nanometer sized features on the wafer.

In order to promote the separation or release, fluorine terminated surfaces have been proposed (see U.S. Pat. No. 6,607,173), and to address both the release and fill requirements, a fractional fluorine terminated surface film, where the fraction may be continuously varied to achieve minimal defect conditions, has been proposed. Chemistries used to deposit fractional F-terminated films use molecular monolayer deposition from organo-silanes, with carbon backbones and fluorine terminations and are referred to herein as flurohydrocarbons or FHC's (see Seidel, T. E., et al., "Fluorine coatings for nanoimprint lithography masks," Proceedings of the SPIE, "Alternative Lithographic Technologies VI" Volume 9049, February 2014, San Jose Calif.).

Many patents have been issued regarding NIL masks (see, e.g., U.S. Pat. Nos. 6,517,977, 7,384,569, 7,541,115, 7,776, 709, 8,088,293, 8,097,539, 8,178,011, and 8,273,505). Also prior work in this area has indicated that the surfaces of the quartz imprint mask may be uncoated (i.e., clean quartz (crystalline $SiO_2$)) or may treated with surfactants or other chemicals (see U.S. Pat. Nos. 7,307,118, 7,452,574, and 7,837,921, and US PGPUBs 2005/0160934 and 2007/0212494). The placement of fluoropolymer material on the surface of a mask using vapor deposition has been described (US PGPUB 2007/0212494). Deposition of reacted fluorohydrocarbon layers on ALD deposited $Al_2O_3$, deposited on polysilicon for reduced sticking in MEMS devices has been described (U.S. Pat. No. 6,562,553). Anti-reflection coatings using fluoropolymer blends have been described (U.S. Pat. No. 7,553,686). A comprehensive review paper of nano imprint lithography includes discussion of mask surface treatments (U.S. Pat. No. 5,198,267). The use of mixtures of miscible chemical precursors has been described for the purpose of making $Hf_xSi_{1-x}O$ dielectric alloy thin (Schift, H., Imprint Lithography, "An old story in modern times, A Review," J. Vac. Sci. Technol. B, Vol. 26, No. 2, March/April 2008).

SUMMARY OF THE INVENTION

Optical intensity simulations, summarized below, indicate the possibility that higher index coating materials affect an increase in the intensity of exposure radiation in the region of the NIL mask feature. In this disclosure, NIL mask designs are described using conformal film coatings with a variety of indices of refraction. Coatings with higher indices of refraction providing higher intensity can provide higher process productivity. Fractional F-terminated layers are combined with indices of refraction larger than the mask material to affect both optimized fill and release and higher process productivity. Finally, the use of conformal coatings having the same or similar optical parameters as the host mask material provides a method for reducing the feature sizes of NIL masks below that obtainable by currently available (e.g., electron beam) methods.

In one embodiment, a structure is proposed for a NIL mask using a host material (such as quartz, $CaF_2$ or other material), using processes known in the art (such as electron beam, resist and etching processes) to fabricate features sizes and feature depths; the mask features are then conformally coated with a film material or materials with a higher index of refraction than the host material. The feature size of the mask, the total film thickness, and film index of refraction of the higher index coating materials are design parameters.

In another embodiment, multilayer conformal coatings on the NIL mask substrate are used to achieve high index of refraction material (which may also be used to ensuring good chemical bonding) underneath a subsequently deposited fractional F-termination layer.

In another embodiment, conformal coatings using substantially the same index of refraction as the host mask material is used to reduce the feature size of the mask.

Regarding the methods to achieve the embodiments, conformal layers can be advantageously formed by Atomic Layer Deposition (ALD) processes as opposed to Chemical Vapor Deposition (CVD). However, CVD processes may also be used if the CVD process provides a conformal film which may be achieved if the sticking coefficient of the CVD reacting precursors is low.

One objective of the invention is to achieve a NIL mask having high index of refraction material conformally placed on the imprint mask, using restrictive thickness for a given mask feature size and restrictive index parameters for a given mask substrate index.

Another objective of the invention is to achieve a NIL mask having first high index of refraction material on the imprint mask, followed by a second layer of a molecular layer of a fractional fluorinated hydrocarbon (FHC), using restrictive thicknesses for a given mask feature size and restrictive index parameters for a given mask substrate index.

Another objective of the invention is to achieve a smaller mask feature size than otherwise possible by conformally coating the mask with a material having substantially the same optical parameters such as the index of refraction and extinction coefficient as the host mask.

DETAILED DESCRIPTION

Simulations of the optical intensity profiles within NIL mask features have been made for patterned quartz masks having ultrathin conformal film coatings with a variety on indices of refraction. Solutions using TEMPESTpr2 and FDTH Maxwell solver software (SW) from Panoramic Technology, Inc. were obtained for intensity profiles within the mask features and explored for variances in the optical constants of the coating films, feature size (FS), aspect ratio (AR), and wavelength, and compared to a bare, uncoated mask reference.

Optical constants corresponding to quartz mask material and for $Al_2O_3$, TiO2 and Si as example coating films were taken from the literature. These bulk values of optical constants are not expected to be the same as actual ultra thin film values applied to the simulations. Thus the simulations are heuristic and semi-quantitative at best. The index of refraction values for the FHC films were assigned a range in an ad-hoc manner. The purpose of using these assigned optical constants is to provide insight and guidance into trends and suggest possibilities. Wavelengths were varied from 193 nm to 365 nm. The question of photo-dissociation of the FHC layer for higher energy photons is addressed from first principles Density Functional Theory (DFT) using Jaguar software (SW) from Schrodinger, Inc., with the result that the FHC layers are stable under exposure to higher wavelengths.

An outline of the results of the simulations is given here. First, the SW output for optical intensity for a reference case for 5 nm quartz mask feature size with no conformal coating(s) is simulated for optical intensity at 365 nm. Following this, comparisons are made using compensated host mask sizes to obtain resultant 5 nm physical feature sizes having conformal coatings with a matrix of various indices of refraction. Simulations for smaller features sizes, various aspect ratios and variances with exposure wavelengths follow. Finally, simulations for conformal coated features filled with resist over various substrates are simulated and partially optimized using antireflection character of the underlying film system. The SW output for the intensity is given in relative ranges relative to the incoming level set at 10. The scale is linear, so an intensity in the range of 1-2 represents intensities from 10 to 20% and 3-4 is 30 to 40%, and so forth. Detailed results for the above can be seen in the publication describing the simulations. (SPIE Photomask Conference Proceedings, Manuscript No. 9635-28, Monterey Calif., 2015.)

Figure 1:
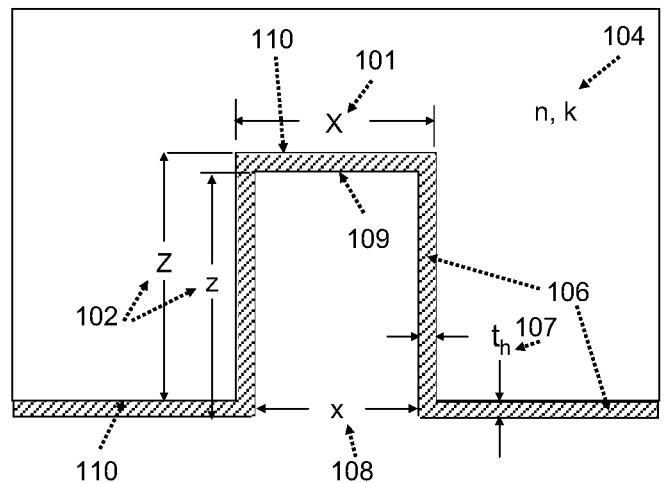
FIG. 1 shows a structure of an imprint mask with a recessed feature having a conformal film chemically bonded to the mask surface with an index of refraction greater than the imprint mask with the film thickness shown as less than one half the mask feature size. The physical feature size is the mask feature size minus twice the film thickness. The physical feature height is the same as the mask feature height.

The intensity profile (intensity in the x-z plane within the feature) for bare, uncoated masks without resist, having mask feature size (MFS) of 5 nm and aspect ratio (AR) of 1 show a uniform intensity profile at the 1-2 level. This 5 nm case with no coating is taken as a reference case. The wavelength used is 365 nm and is used for all other cases unless stated otherwise) The index of refraction for the quartz is 1.47, with a k value of 0.001. This was compared to cases with assigned values of conformal coating materials with indices of refraction varying from 1.3, 1.8 and 2.3 and k=0.001. A conformal film coating is defined as one having a constant thickness within ~5% along the contour of the feature, for example as illustrated in FIG. 1. The mask with conformal coatings was compensated up in size to give the same physical feature size (PFS) as the 5 nm control.

The intensity levels of the coated mask having the same 5 nm physical feature size as the control using an index or 1.3 show nominally the same values as the uncoated mask. This might be expected since the index for the n=1.3 layer is not too different from the quartz (1.3 vs. 1.47). It is concluded that when the index of refraction for the conformal coating is substantially the same (+/−~15%) as the host mask, the optical intensity profile in the feature is the same. This implies that feature sizes of NIL masks may be reduced by using conformal coatings of like index materials. In the case of quartz (chemically $SiO_2$) made with a relatively large feature size could be conformally coated with ALD layers of $SiO_2$. In the case of a NIL mask made from $CaF_2$ material, a conformal ALD coating of $CaF_2$ could be used. ALD processes for $SiO_2$ and metal fluorides are available (see S. Yokoyama, et al. Appl. Phys. Lett. 79, 617 (2001), and J. W. Klaus, et al. Surf. Rev. Lett. 6, 435 (1999); Younghee Lee and Steven M George, et al, "Atomic Layer Deposition of Metal Fluorides using various metal precursors and hydrogen fluoride," Abstracts Technical Program and Abstracts of ALD15 Portland, 2015). While the ALD layers may not have the same exact micro-structure or impurity content as the host mask material, their optical properties can be similar enough to provide an optical match to the host mask. Any NIL masks can be coated with the same material of construction, or coated with a material with equivalent n and k optical parameters as the host mask to make smaller controlled feature sizes.

When the coating index is increased from 1.3 to 1.8 and 2.3 (compared to a mask value of 1.47) the intensity is progressively increased near the feature edges of the mask to the 3-4 level, while maintaining a 1-2 level in the center of the mask. This implies use of a coating index film with an index substantially higher than the mask index can increase the intensity within the mask feature.

Figure 2:
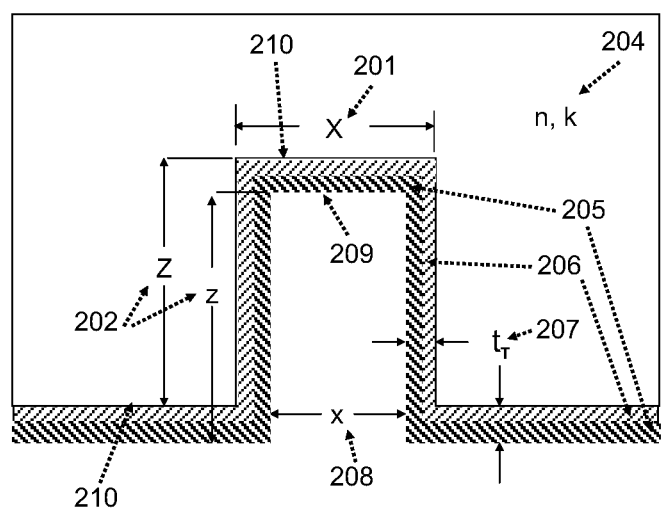
FIG. 2 shows a structure of an imprint mask with recessed features having two multilayer and conformal films chemically bonded to the mask surface: one an underlayer abutting the mask surface and a top layer of an FHC coating abutting to the top of the underlayer.

If two conformal layers are used, as illustrated in FIG. 2, consisting of an "underlayer" with indices of 3 and 6 and a top conformal layer with an n value of 1.8, the intensities in the PFS are progressively higher over larger (x,z) areas. For the combination $n_u$=1.8 and $n_r$=3, the intensity level is 3-4 over a third of the feature. For $n_u$=1.8 and $n_r$=6, the intensity level is 3-4 over the entire central region spanning the x dimension and reaches the 5-6 level near the edges of the feature. Other combinations using an ad hoc value of 2.3 for the top layer and 3 and 6 for the underlayer provides still further progressively higher intensities within the feature. This implies that combined conformal (multilayer films) having an underlayer index substantially higher than the mask and a top layer substantially the same index as the mask (or higher) may increase the optical intensity in the feature This indicates that the use of high index conformal coatings used as underlayers, e.g., under an FHC layer, can have higher intensities in the PFS, while also improving release characteristics.

Intensity simulations were made for a variety of physical aspect ratios. The aspect ratio is defined as the feature depth divided by the feature inside width which is the space where resist may be placed. The AR's ranged from 0.7 to 2.85. For this set of simulations the wavelength was 200 nm and the mask feature size was 5 nm. After conformal film coatings, the physical mask size was less than 5 nm. An intensity level 3-4 over 80% of the physical feature cross sectional area was obtained for a 3.8 nm PFS, n=1.3 and AR=1.31. Intensity levels of 5-6 at the center and 6-7 level at the edge were obtained for a 3.4 nm PFS, n=1 (top layer) and n=3 (underlayer) and AR=1.47. This implies that multilayer combinations with a modest index n=1.3 assigned for the top layer and n=3 for the underlayer can yield significantly large intensities, especially at smaller physical feature size. Intensities were 4-5 top and bottom and 5-6 in the center of the cross section for a physical AR=2.85. AR~0.71, intensities were low and not much different than a control without a high index coating. These results imply better intensities may be obtained as features get smaller and perhaps with increasing aspect ratios.

Cases of AR~2 were simulated for mask features sizes of 8, 10 and 20 nm, using 200 nm wavelength and index n=3 and compared to no layer coating on the mask. In all cases, there was essentially no difference in the intensity profiles between FHC and no FHC. The increased intensity effect is operative for feature sizes of the order of 5 nm and less, but not for feature sizes at 8 nm and above.

The wavelength dependence was addressed by comparing the intensity profiles at 356 nm, 256 nm and 193 nm for various multilayer combinations. The optical constants assumed were n=1.3 (corresponding to an assigned FHC value) for the top layer and n=3 corresponding to bulk $TiO_2$, k=0.001 at all wavelengths for the underlayer and for bulk Si: n=6.5, k=2.71 at 365 nm; n=1.61, k=3.79 at 256 nm and n=0.88, k=2.78 at 193 nm. For quartz, n=1.47 at 365 nm, 1.50 nm at 256, and n=1.56 at 193 nm. Dispersion was used for Si and quartz indices. The physical feature size for this comparison is 3.8 nm for the single coating of n=1.3 and a PFS=3.4 nm for the multilayer coatings with n=3 as underlayer and n=1.3 on top, and n=6.5 as underlayer and n=1.3 on top. The corresponding AR for the physical feature size is 1.31-1.38. In all cases the intensity profile is non-uniform, but always higher than in the quartz outside the mask feature. In summary at 365 nm, for a single layer coating, the intensity levels are 1-2 in the center and 3-4 at the edges of the feature; for an underlayer with n=3 and a top layer of n=1.3 the intensity levels were 3-4 at the edges and center. For an underlayer of n=6, and a top layer of 1.3, the intensity levels were 3-4 at the center and 5-6 near the edges. For these cases the intensities increase with increased index value for the underlayer.

First principles calculations for photo-dissociation were made for the ligands of a proposed fluorine terminated molecule, the same layer that is represented by ad-hoc assignment of an index 1.3, or 1.8 or 2.3. Density Functional Theory from the Materials Science Suite (MSS) from Schrodinger Inc. provides a DFT code Jaguar and a workflow to calculate the Bond Dissociation Energy (BDE). BDE values were calculated for 27 ligands of both a F-terminated and non F-terminated amnosilane molecules. The five possible C—H pairs had dissociation energies ranging from 98.43 to 106.8 kcal/mole. The two C—Si ligands had BDE values of 93.5 and 94.06 kcal/mole. Conversions to corresponding wavelength used the relations: 23.1 kcal/mol=1 eV/molecule and E=hv, where h=4.13 eVsec/molecule and v=c/free space wavelength. The wavelength is 310 nm for the lowest BDE (93.5 kcal/mole) for breaking a C—Si bond. Wavelengths shorter than 310 nm may dissociate a variety of FHC ligands. As a result, the stable use of a FHC layers may be pursued using exposure sources like the 356 nm i-line source.

Simulations using resist in the mask feature with underlying substrates showed less intensity in the feature than those simulated for air cavity features discussed above. Anti-reflection conditions were employed to increase the intensity in the resist. A pattern transfer case was simulated for making a hard mask of $SiO_2$ over Cu, and the thickness of the $SiO_2$ was varied to increase the intensity. AZ 1500 type resist at 365 nm was used with its index of refraction and extinction coefficient for an unexposed condition. For the condition of no coating and a PFS of 5 nm, the intensity was uniform at the 1-2 level. An intensity level of 2-3 was obtained when one conformal coating with an n=1.8 was used and the mask was compensated to also provide a matched 5 nm PFS. For a top layer FHC n=1.8 and a underlayer of n=6.5, having PFS=4.4 nm, the intensity near the bottom of the resist filled mask is at the 2-3 level uniformly—in the x direction—across most of the bottom of the mask feature and 3-4 near the lower edges of the mask. These increased intensities may reduce exposure times. Even though the intensities are non-uniform within the feature, if the increased intensity is uniform across the width of the feature—as it is in this simulated case—the integrity of the exposed resist feature may be maintained and the exposure process can be useful.

Several figures are used to connect the simulations to mask designs. In FIG. 1, a NIL mask (100) is illustrated, e.g., with a material of construction of quartz, as may be patterned by electron beam methods known in the art to affect a "drawn" mask feature size (MFS) of width dimension X (101) with depth dimension Z (102). The index of refraction n and extinction coefficient k for the mask's material of construction (104) at the wavelength of operation are known, e.g., for quartz: n=1.47, k=0.001 at 365 nm. A conformal film (106) with a different (advantageously) higher index of refraction, $n_h$, and different extinction coefficient, $k_h$, characteristic of the conformal film of thickness $t_h$ (107) is deposited conformally over the mask feature. This results in a physical feature size width dimension of x=X−$2t_h$ (108), since the conformal film encroaches on the width of the drawn mask width feature size on each surface of the feature. The depth is unchanged by the conformal coating, z=Z (102), as the feature's inside top surface (110) is reduced by the same amount that is added to the mask's external lower surface (110). The simulations indicate that intensity is increased in the PFS when using a conformal coating of index greater than that of the NIL mask's material of construction. The high index film thicknesses $t_h$ will be less than half the mask feature size. Mask feature sizes are less than 8 nm for the higher intensity to be effective.

In FIG. 2, a NIL mask (200) is illustrated, e.g., with a material of construction of quartz, with a "drawn" mask feature size (MFS) of width dimension X (201) with depth dimension Z (202). The index of refraction n and extinction coefficient k for the mask's material of construction (204) at the wavelength of operation are known at 365 nm. A conformal underlayer film (206) with a higher index of refraction, $n_h$, than the material of construction and possibly a different extinction coefficient, $k_h$, characteristic of the conformal film of thickness $t_h$ is deposited conformally over the mask feature. In addition, a conformal F-terminated monomolecular layer is deposited as a top layer on the underlayer, having index of refraction $n_F$, extinction coefficient $k_F$, and thickness, $t_F$. This allows a definition of the total conformal film thickness (207), $t_T = t_h + t_F$ and the average index as $n_a = (n_h t_h + n_F t_F)/t_T$. This results in a physical feature size width dimension of $x = X - 2t_T$ (208). The depth is unchanged by the conformal coatings, $z = Z$ (202), as the feature's inside top surface (210) is reduced by the same amount that is added to the mask's external lower surface (210). For the case of multilayer conformal films, the average index of refraction is designed to be greater than the NIL mask's material of construction and high total conformal laminate index film thicknesses $t_T$ will be less than half the mask feature size. Mask feature sizes are less than 8 nm for occurrence of higher exposure intensity inside the feature. The benefit of such a design is to obtain higher process productivity and simultaneously lower defect density for NIL masks.

Figure 3:
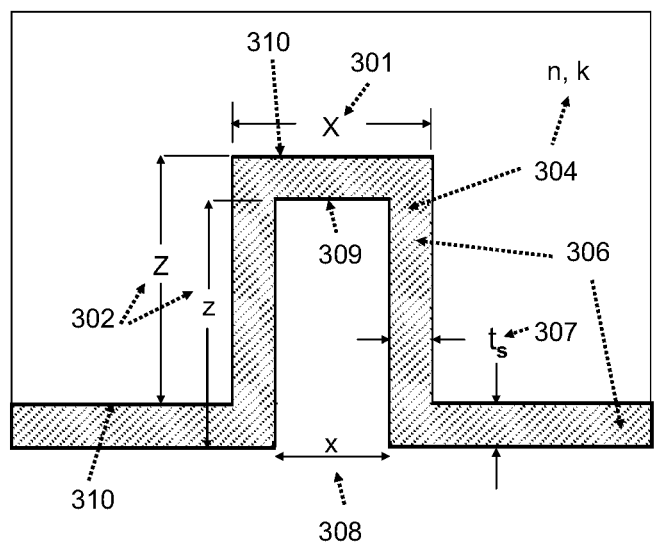
FIG. 3 shows a structure of a host imprint mask with a larger compensated feature size coated with a conformal film made from a material with substantially similar optical parameters as the host to achieve a smaller feature size.

In FIG. 3, a general NIL host mask (300) with a minimum width dimensions (301) is shown with a feature size that is less than desired. The material of construction has optical constants: index of refraction, n and extinction coefficient k, (304). The mask is conformally coated with a film (306) with thickness $t_s$ (307) using a material having substantially the same optical constants (304) as the host mask to enable the reduction of the feature size to a desired smaller value. (308). The index of refraction of the conformal film, $n_s$, may be substantially the same as the host mask, e.g $n_s = n +/- 15\%$. The difference in the $k_s$ value relative to k may only be limited by attenuation by absorption of intensity due to the addition of the conformal coating film. This method and mask design provides a smaller width feature size (308) and does not change the depth (Z=z) of the feature (302), as the film adds the same thickness to the interior and exterior surfaces (310), resulting in a new interior surface (309). The desired smaller targeted feature size (308) is $x = X - 2t_s$.

The absorption coefficient (alpha=k/wavelength) and the film's thickness should not reduce the incident intensity by more than a few percent for any of the applications discussed herein. The relationship: the extinction coefficient times the conformal film thickness (conservatively taken as the film's z dimension), divided by the exposure wavelength should be set at less than 0.05. This defines the condition for the added conformal film not to substantially reduce the exposure intensity. For the case of two (or more) conformal films placed on the mask feature, the absorptions are in parallel and each film uses the same above relation. The film material with the highest extinction coefficient dominates the loss of intensity.

In summary, optical intensity profiles in trenches of NIL coated masks were simulated. The geometry, optical constants, wavelength and coatings on the trench features were varied. Mask design conditions for increased exposure intensity are proposed. Use of a nanolaminate design with higher index placed as an undercoating below a fractional FHC coating of a moderate index of refraction are proposed for both lower fill and release defects as well as higher optical intensity and higher process productivity. Finally, the concept that conformal films having the same or substantially the same index of refraction as the host mask material can provide an approach for compensating the mask to obtain smaller feature sizes than is currently available using standard methods.

What is claimed is:

1. A nanolithography imprint mask comprising: a mask material having an index of refraction, extinction coefficient, and mask features, said mask features coated with a conformal film of a material having at least an index of refraction higher than 15 percent above the index of refraction of the mask material, wherein a thickness of the conformal film is less than half of a size of the mask features, said mask feature size being less than 8 nm, said mask having a physical feature aspect ratio of at least 0.7, and an extinction coefficient of the conformal film low enough that it does not substantially reduce an exposure intensity within the coated mask features.

2. The nanolithography imprint mask of claim 1, wherein said mask features comprise mask features coated with at least a first underlayer conformal film material having a higher index of refraction than the mask material index of refraction.

3. The nanolithography imprint mask of claim 2, wherein said first underlayer is located under at least a second top layer film having a fractional fluorinated termination.

4. The nanolithography imprint mask of claim 3, wherein a combined thickness of the first underlayer and second top layer films is less than half a mask feature size.

5. The nanolithography imprint mask of claim 2, wherein an average index of refraction of the first underlayer and second top layer films is larger than the index of refraction of the mask material.

6. The nanolithography imprint mask of claim 2, wherein a highest extinction coefficient of the first underlayer conformal film does not substantially reduce an exposure intensity within the coated mask features.

* * * * *